United States Patent [19]

Sugayama et al.

[11] Patent Number: 5,339,453

[45] Date of Patent: Aug. 16, 1994

[54] AGC CIRCUIT FOR RADIO RECEIVER HAVING AGC SENSITIVITY COMPENSATED BY IF OUTPUT SIGNAL

[75] Inventors: Sakae Sugayama; Keiji Kobayashi, both of Gunma, Japan

[73] Assignee: Sanyo Electric Co., Ltd., Osaka, Japan

[21] Appl. No.: 723,077

[22] Filed: Jun. 28, 1991

[30] Foreign Application Priority Data

Jun. 29, 1990 [JP] Japan .................................. 2-171851
Oct. 31, 1990 [JP] Japan .................................. 2-295023

[51] Int. Cl.$^5$ ............................................ H04B 1/26
[52] U.S. Cl. .............................. 455/239.1; 455/245.2; 455/247.1; 455/254
[58] Field of Search ............... 455/234.1, 239.1, 240.1, 455/241.1, 245.2, 246.1, 247.1, 249.1, 250.1, 254, 245.1, 200.1

[56] References Cited

U.S. PATENT DOCUMENTS

| | | | |
|---|---|---|---|
| 4,455,681 | 6/1984 | Wile | 455/246.1 X |
| 4,580,288 | 4/1986 | Rinderle | 455/239.1 |
| 4,776,040 | 10/1988 | Ichikawa et al. | 455/241.1 X |

OTHER PUBLICATIONS

"Bipolar Integrated Circuit for Car-Audio", '88 Sanyo Semiconductor Handbook, published on Mar. 1, 1988.
"Car Audio Bipolar Integrated Circuit", '88 Sanyo Semiconductor Data Book.
Patent Abstracts of Japan, vol. 4, No. 117 (E-22)(599) Aug. 20, 1980.
Patent Abstracts of Japan, vol. 8, No. 115 (E-24)(1552) May 29, 1984.
Patent Abstracts of Japan, vol. 9, No. 81 (E-307)(1804) Apr. 10, 1985.
"Development of One-Chip IC For Car Tuners", IEEE 1988 International Conference on Consumer Electronics, Digest of Technical Papers ICCE, Jun. 8-10, 1988, pp. 270-271.
"Advanced FM-IF", IEEE Transactions on Consumer Electronics, vol. CE-28, No. 3, Aug. 1982, pp. 383-392.

*Primary Examiner*—Reinhard J. Eisenzopf
*Assistant Examiner*—Chi Pham
*Attorney, Agent, or Firm*—Armstrong, Westerman, Hattori, McLeland & Naughton

[57] ABSTRACT

An AGC circuit comprising a first level wave-detecting circuit for wave-detecting received signals having been band-limited, having a sensitivity being particularly high for a central frequency of a desired channel and a sensitivity being low for the other frequencies, and a second level wave-detecting circuit for wave-detecting received signals before the band-limitation having a sensitivity being constant irrespective of the frequency. Since the wave-detected signals of these two wave-detecting circuits are mutually added, it is possible to set an optimum detecting sensitivity by the first level wave-detecting signal against adjacent disturbances close to the central frequency of the desired channel, thereby effectively suppressing disturbance signals taking place when the respective intensities of the electric fields of adjacent channels are similar. Also, it is possible to set a constant detecting sensitivity by the second level wave-detecting signal against an intermodulation disturbance having a detuning degree over a predetermined value, thereby preventing an excessive sensitivity suppression of the frequency of the desired channel caused by an excessive AGC application.

6 Claims, 6 Drawing Sheets

AGC CIRCUIT FOR RADIO RECEIVER HAVING AGC SENSITIVITY COMPENSATED BY IF OUTPUT SIGNAL

BACKGROUND OF THE INVENTION

1. Field of the Invention:

This invention relates to an AGC circuit used in a FM radio receiver, for example, and more particularly to an AGC circuit having an improved intermodulation disturbing property and an improved adjacent channel disturbing property.

2. Description of the Related art:

FIG. 7 of the accompanying drawings illustrates an equivalent circuit of a conventional AGC circuit used in a vehicle-mounted FM radio receiver. This AGC circuit, performing AGC by detecting the output signal level of a mixer, is disclosed in "'88 SANYO SEMI-CONDUCTOR DATA BOOK, CAR AUDIO BIPOLAR IC VOLUME (CQ PUBLISHING COMPANY)" at pages 124–136.

In FIG. 7, the numerals designate, respectively: 10, a AGC circuit (AGC) integrated on an IC 12, for example; 14, an antenna circuit (ANT), the output of which is supplied to a first gate of a RF amplifier 16, and to which a pin diode 18 being an attenuator (ATT) of the ANT 14 is coupled to control the gain (attenuating amount) of the ANT 14; 20, a mixer (MIX) to which antenna signals having been amplied in the RF amplifier and local oscillating signals from a local oscillator (OSC) through a buffer 24 are input to perform a frequency conversion from the RF to the IF; 26, a level detector for detecting the level of an IF signal being the output signal from the mixer 20, the detected level signal being input to AGC 10.

The AGC 10 generates an AGC signal when the signal level becomes equal to or above a predetermined level to execute gain control of the antenna circuit 14 and the RF amplifier 16.

Namely, such an AGC is necessary because the level of the signal to be input to the radio receiver greatly changes depending on the distance from the transmitting channel, propagating conditions or the like, and it must be adusted to be within the optimum range of the processing carried out in the receiver. In particular, in a vehicle-mounted receiver, since the distance from the transmitting channel changes with the passage of time, and the propagating condition is greatly different depending on the running position of the vehicle, the antenna input level would change greatly within a range of 1 $\mu$V–3 V, for example. Accordingly, such an AGC circuit would be indispensable to provide a satisfactory receiving state even in case of the signal level being low, and to provide a non-jamming signal reception suppressing the stresses caused by the higher harmonic wave produced by a non-linear element such as a transistor, FET, or a variable capacitance diode at the time of receiving extremely high level signals.

The AGC signal is applied to the pin diode 18 and the second gate of the RF amplifier 16 through the 6th pin and the 13th pin of the IC 12, respectively, so as to reduce the level of the RF signal. In this manner, the AGC 10 functions to keep the output level of the mixer 20 constant by the AGC signal.

In this case, the relationship of the mixer input frequency to the AGC sensitivity will be represented as shown in FIG. 8. As shown in FIG. 8, the larger the detuning degree $\Delta f$ with respect to the central frequency ($\Delta f = 0$) of a desired channel, the lower the AGC sensitivity.

If no AGC is provided, a third higher harmonic wave may be caused by non-linearity of, e.g., Tr, when the input levels of ANT and MIX become larger, thereby degradating the IM (intermodulation) disturbing property. Therefore, the AGC is provided to attenuate the RF signal and to suppress the generation of these stresses, in order to improve the disturbing property.

As disturbances to be considered in the AGC circuit, an intermodulation disturbance (three signal property) and a adjacent channel disturbance (two signal property) can be listed.

The former is a disturbance generated by mixing the higher harmonic wave caused by the non-linearity of the element due to the level of the large signal input with a desired station frequency. For eliminating this intermodulation disturbance, the signal level at a frequency band remote from the desired channel frequency is attenuated by the AGC circuit. Therefore, it is preferable to set the AGC property to a broad band AGC.

On the contrary, the latter adjacent channel disturbance occurs when a strong electric field disturbance channel exists near the desired channel, and the desired channel is a weak electric field.

Namely, for generating an AGC signal from the mixer output in the above-mentioned prior art, if an adjacent channel has a large electric field intensity with respect to the desired channel, the AGC would emit the AGC signal to the adjacent channel due to the property represented in FIG. 8. At this time, the signal level of the desired station tends to be simultaneously attenuated, consequently, the mixer input becomes extremely small.

Further, when an AGC signal is generated from the mixer input by improving the conventional circuit, the AGC circuit would operate incorrectly due to a local oscillating signal. Namely, as mentioned above, a local oscillating circuit composed of the local oscillator 22 and the buffer 24 is provided at the front end of the FM receiver, and the signal level, 300 mVrms–1 Vrms, is quite higher than the mixer input level. In addition, the frequency of the local oscillating signal is so high as 50 MHz–120 MHz, near the mixer input signal band. Therefore, the local oscillating signal would tend to invade the AGC circuit through the GND line, the Vcc line, or the space propagation, generating an erroneous AGC signal due to the local oscillating signal level. Such a operation of the AGC circuit would reduce the gain of the RF amplifier significantly, thereby degradating the sensitivity.

Therefore, in case of applying AGC to a detected mixer input level, the sensitivity of the AGC must be reduced. But by this reduction, an additional problem, that of the disturbance (eliminating) property with respect to a frequency particularly having a small detuning degree $\Delta f$ is degraded, would newly arise.

Conventionally, as a further improved AGC circuit, keyed AGC is well known. In this keyed AGC, the controlling level of the AGC circuit is compensated by the use of the IF section output level of the radio receiver.

Thus, in this conventional circuit, the AGC controlling amount is reduced or cut off when the output level of the IF section is low so as to prevent the sensitivity degradation.

However, in such a keyed AGC, there has occur an inconvenience that the keyed AGC would operate even in a non-signal state having no output level, thereby significantly amplifying the intermodulation disturbance.

SUMMARY OF THE INVENTION

It is therefore an object of the present invention to provide an AGC circuit which is capable of effectively suppressing both the intermodulation disturbance and the adjacent channel disturbance, and of preventing the invasion of the local oscillating frequency signal, so as to set an optimum AGC level.

In view of this object, in this invention, there is disclosed an AGC circuit for a radio receiver which detects a receiving signal level to generate AGC signals corresponding to the detected signal level, and controls the gain of an RF amplifying circuit, said AGC circuit comprising: a filter circuit for allowing components of a predetermined frequency band in the output signal from a mixer to pass therethrough; a first level detecting circuit, having a detecting sensitivity varying in accordance with the detuning degree with respect to a predetermined central frequency, which detects the output signal level of the mixer having a frequency band being limited by said filter circuit; a second level detecting circuit having a detecting sensitivity constant irrespective of the detuning degree with respect to the central frequency, which detects the input signal level of the mixer; an adder circuit for adding the first level detecting signal to the first level detecting signal to output as the AGC signal.

The AGC circuit of this invention is enabled to set the optimum detecting sensitivity, for the adjacent disturbance near the central frequency of the desired channel, by the first level wave-detecting signal, thereby effectively reducing the disturbing signal generated when the intensity of the electric field of the adjacent disturbing channel is high.

Further, against a intermodulation disturbance having a detuning degree above a predetermined value, a constant detecting sensitivity is set by the second level wave-detecting signal, preventing the excessive suppression of the sensitivity of the desired channel frequency due to the excessive application of the AGC.

In addition, according to this invention, the level of the desired channel frequency of the IF section is detected by the S meter. By the output from this S meter, the output from the first level wave-detecting circuit is controlled. As a result, the AGC at a middle band set around the desired channel frequency can be compensated by the output level of the IF section.

Accordingly, by applying the keyed compensation, conventionally applied to all the AGC circuits, only to the first level detecting signal obtained from the mixer output, the middle band AGC can be controlled by the IF section output, and the AGC for a broad band can be supplied in a constant value.

Thus, according to the AGC circuit of this invention, both the intermodulation disturbance and the adjacent channel disturbance can be greatly eliminated by providing a first and a second AGC systems detecting the output/input levels of the mixer, each having an individual detecting sensitivity different from each other. Further, according to this invention, since the first AGC system, for performing the middle band AGC in accordance with the output level of the IF section, is compensated, the inconveniences in the conventional keyed AGC can be greatly eliminated.

The above and other advantages, features and additional objects of this invention will be manifest to those versed in the art upon making reference to the following detailed description and the accompanying drawings in which a preferred structural embodiment incorporating the principles of this invention is shown by way of illustrative example.

DETAILED DESCRIPTION

Figure 1:
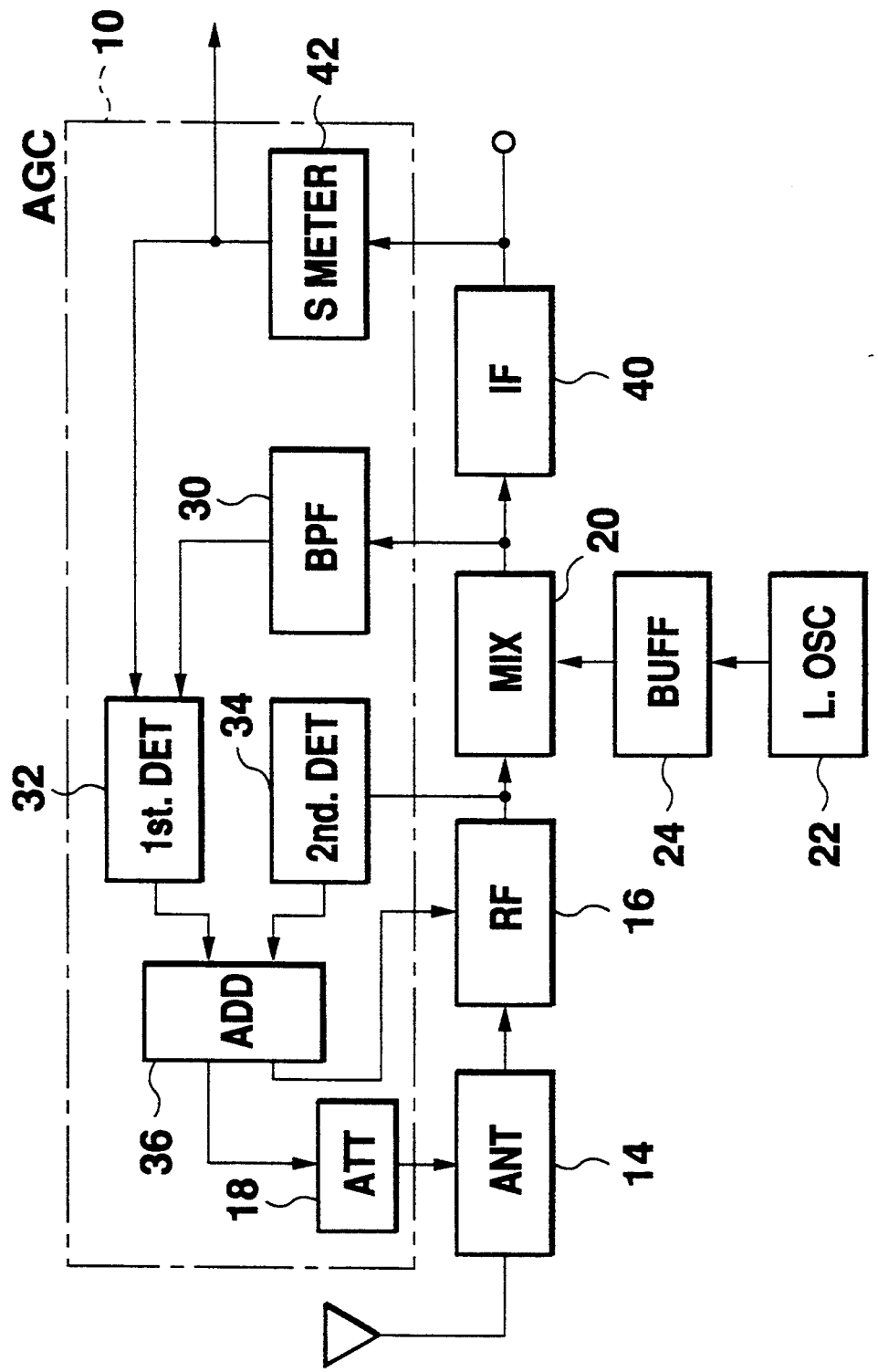
FIG. 1 is a circuit block diagram showing an embodiment of an AGC circuit according to this invention.

The principles of this invention are particularly useful when embodied in an AGC circuit such, as shown in FIG. 1. In FIG. 1, the same numerals designate the same or corresponding components as those in FIG. 7.

In FIG. 1, the numeral 30 designates a band-pass-filter for shutting out signals over 50 MHz in the output signal line of the mixer 20 to eliminate local oscillating signals (50 MHz–120 MHz).

The numeral 32 designates a first level wave-detecting circuit of this invention, having a detecting sensitivity which lowers in accordance with the detuning degree $\Delta f$ with respect to a predetermined central frequency e.g. IF frequency f1.

The first level wave-detecting circuit 32 constitutes a first AGC system for applying AGC to the detected output signal level of the mixer 20 having its frequency band-limited by the band-pass-filter 30.

Figure 3:
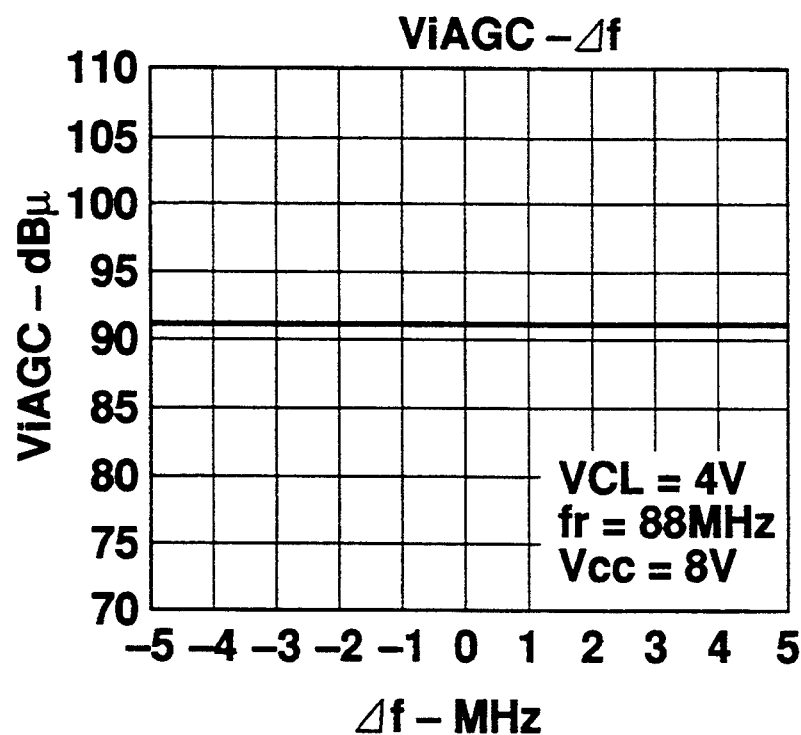
FIG. 3 is an AGC sensitivity diagram in the second level wave-detecting circuit.

The numeral 34 designates a second level wave-detecting circuit. As shown in FIG. 3, this circuit 34 has a constant detecting sensitivity irrespective of the central frequency, e.g., a detuning degree with respect to the tuning frequency. The second level wave-detecting circuit 34 constitutes a second AGC system for detecting the input signal level of the mixer 20 in accordance with the detecting sensitivity.

Since a high-frequency, such as in the range of 60 MHz–110 MHz, is input to the second level wave-detecting circuit 34, the frequency property of the level wave-detecting circuit 34 must have a broad band-pass characteristic of at least approximately 110 MHz. Such a frequency band is substantially the same as that of the local oscillating signals (50 MHz–120 MHz), which would cause incorrect functioning of the AGC 10 by a sudden invasion of the local oscillating signal. Therefore, in this embodiment, the AGC sensitivity (detecting sensitivity) in the second level wave-detecting circuit 34 must be restricted to be lower than that in the first level wave-detecting circuit. This AGC sensitivity is set to such a value which would not cause any incorrect operation and which could eliminate the intermodulation disturbance mentioned above.

The numeral 36 designates an adding circuit for outputting an AGC signal from the AGC circuit 10 by adding the first level wave-detecting signal to the second level wave-detecting signal. The adding circuit 36 includes an offset circuit for determining the offset amount of the AGC controlling signal output from the adding circuit 36. In the two systems of the AGC circuit 10 according to this embodiment, the local oscillating signals over 50 MHz (up to 120 MHz) are first eliminated from the output signal level of the mixer 20 by the band-pass-filter, and then the first level wave-detecting circuit 32 outputs the first level wave-detecting signal in accordance with the property represented in FIG. 2.

The second level wave-detecting circuit 34 outputs the second level wave-detecting signal from the input signal level of the mixer 20 in accordance with the property represented by FIG. 3.

The first and the second level wave-detecting signals are mutually added in the adding circuit 36, and this AGC controlling signal is supplied to the attenuator 18 of the antenna circuit 14 and the RF amplifying circuit 16.

Figure 2:
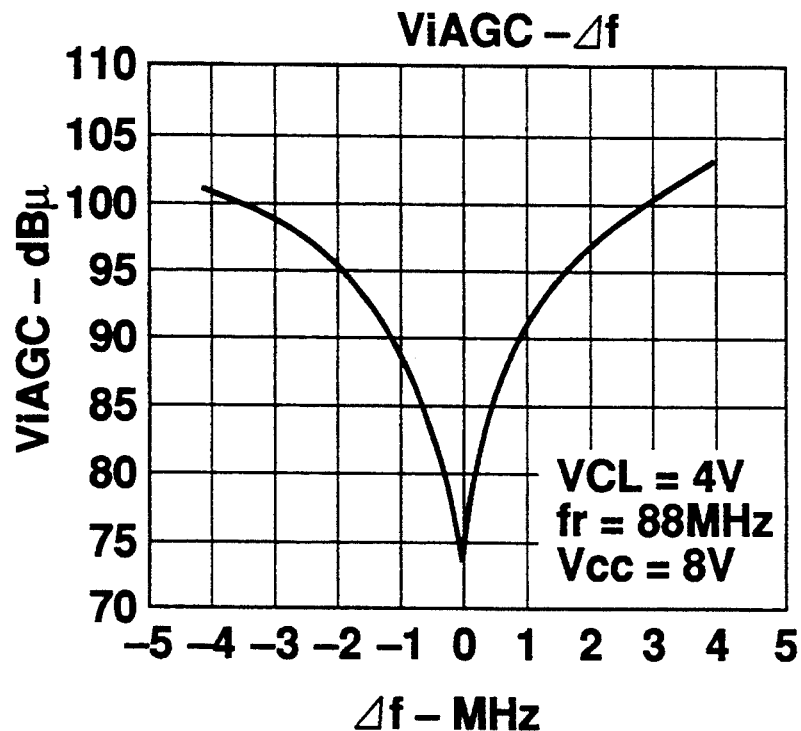
FIG. 2 is an AGC sensitivity diagram in the first level wave-detecting circuit.
Figure 4:
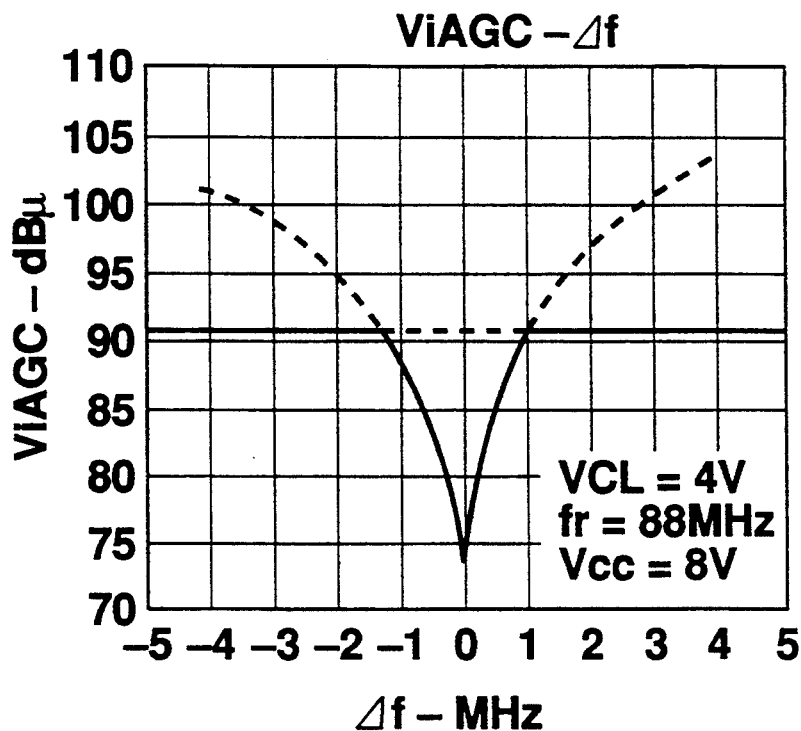
FIG. 4 is an synthetic AGC sensitivity diagram in this invention.

According to the two-system AGC of this embodiment, the integral properties could be represented by FIG. 4 formed by superimposing FIGS. 2 and 3. In FIG. 4, at an area with a detuning degree relatively close to the central frequency, namely at a middle band area with a range of $F = \pm 1$ MHz, mainly the first AGC system having the higher detecting sensitivity functions in accordance with the output signal level of the mixer 20. Meanwhile, at a broad band where the detuning degree is larger than that, the second AGC system has a priority to operate, in accordance with the input signal level of the mixer 20.

Therefore, according to this invention, it is possible to realize an AGC operation capable of most effectively coping with any type of disturbances, by dividing the bands into a middle band and a broad band on the basis of the detuning degree from the central frequency and applying individual AGC to each of them.

Namely, for the broad band, the detecting sensitivity is kept constant by the second level wave-detecting circuit 34, thereby preventing the intermodulation disturbance over a broad frequency band, and preventing the excessive suppression of the detecting sensitivity of the central frequency by an excessive AGC application.

Meanwhile, for the adjacent channel disturbance at frequencies close to the central frequency, the undesirable influences of the local oscillating signal can be eliminated by disposing a band-pass-filter capable of shutting out signals over 50 MHz, and by enhancing, at the detuning time, the constant detecting sensitivity of the second level wave-detecting circuit to be higher than that of the first level wave-detecting circuit.

In the present invention, further, the disadvantages having arisen by, e.g., a conventional keyed AGC can be certainly eliminated by applying an AGC compensation to the first AGC system by the output level of the IF section.

In FIG. 1, the IF section for executing FM demodulation upon receiving the output from the mixer 20 at the front end, is designated by a numeral 40. In this embodiment, the output of this IF section, being a multi-stage limiter, is taken as a narrow band signals because of having a central frequency component. This IF signal is supplied to the S meter 42 where the signal level of a desired channel is detected. Of course, the output of the S meter (signal meter) 42 is used by the other circuits of the radio receiver, in this embodiment the output of the S meter 42 is supplied to the first level wave-detecting circuit 32 for compensating the detecting sensitivity in accordance with the output level of the IF section.

Figure 5:
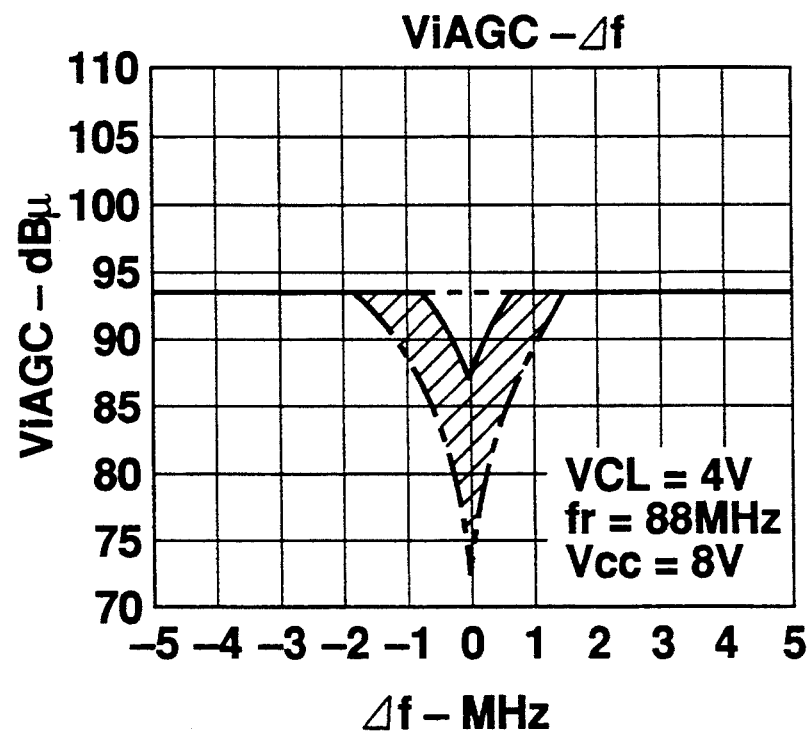
FIG. 5 is a synthetic AGC counting property diagram compensated by the output of the IF section according to this invention.

FIG. 5 shows an AGC compensating operation of the first AGC system by the output of the IF section. In the middle frequency band, the detecting sensitivity is controlled as shown by section lines from the state of the dashed line to the state of the solid line in accordance with the output level of the IF section.

The chain line in FIG. 5 stands for a detecting sensitivity for the second AGC system in substantially same manner as in FIG. 4, in the case where the output of the IF section is sufficiently large.

On the contrary, the solid line in FIG. 5 stands for a state where the output level of the IF section is lowered. In this state, the lowered control by the first AGC system acts to certainly prevent the excessive AGC application by the conventional keyed AGC, mentioned above.

Figure 6:
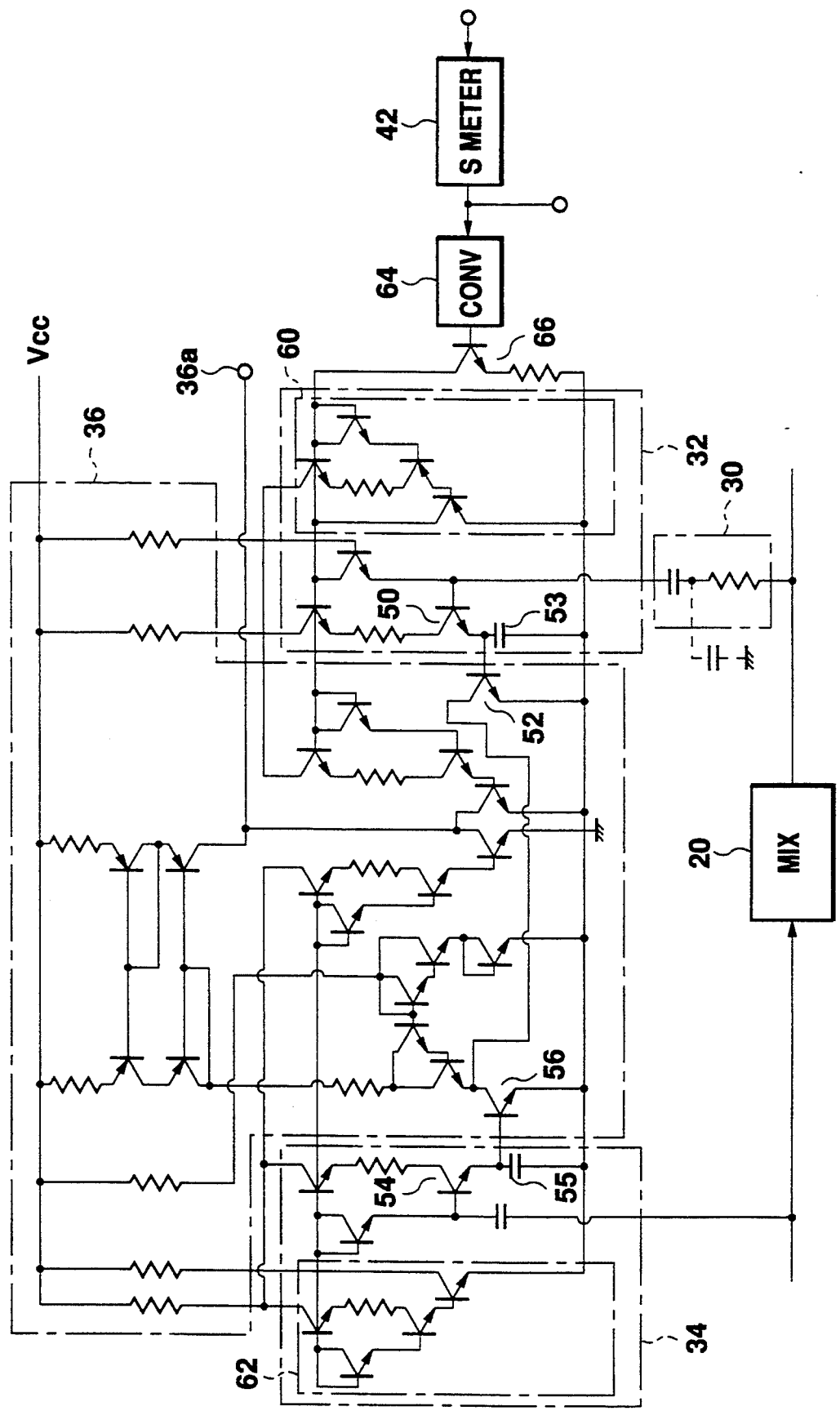
FIG. 6 is a specific diagram showing a preferred embodiment of an AGC circuit according to this invention.

FIG. 6 shows a more detailed AGC circuit diagram according to this invention, where the same components as in FIG. 1 are designated by the same numerals and omitted to be mentioned.

In FIG. 6, the band-pass-filter 30, for supplying the output signal of the mixer 20 to the first level wave-detecting circuit 32 by limiting the frequency band, is composed of, e.g., a ceramic filter, which is represented equivalently by a resistor and a condenser. Alternatively, the shown band-pass-filter 30 can be installed separately from the ceramic filter as a two-staged filter. In such a case as the AGC circuit being composed of an IC and having the band-pass-filter therein, a stray capacitance (parasitic capacitance) would arise, as shown in dashed line. In such IC, therefore, the frequency of the band-pass-filter 30 is determined taking account of the parasitic capacitance.

The output of the band-pass-filter 30 is supplied to the base of the transistor 50 in the first level wave-detecting circuit 32, and the signals according to the property shown in FIG. 2 are supplied to the first input transistor 52 in the adder circuit 36. The condenser 53 keeps the potential according to the current flowing through the transistor 50 at its upstream side, thereby currents according to the level of the input signal to the first level circuit 34 flow through the transistor 52.

The input signal level of the mixer 20 is supplied to the base of the transistor 54 provided in the second level wave-detecting circuit 34, the output of which is supplied to the base of the second input transistor 56 in the adder circuit 36, as shown in FIG. 3. The condenser 55 keeps the potential according to the current flowing through the transistor 54 at its upstream side, thereby current according to the level of the input signal to the second level circuit 34 flows through the transistor 56.

Figure 7:
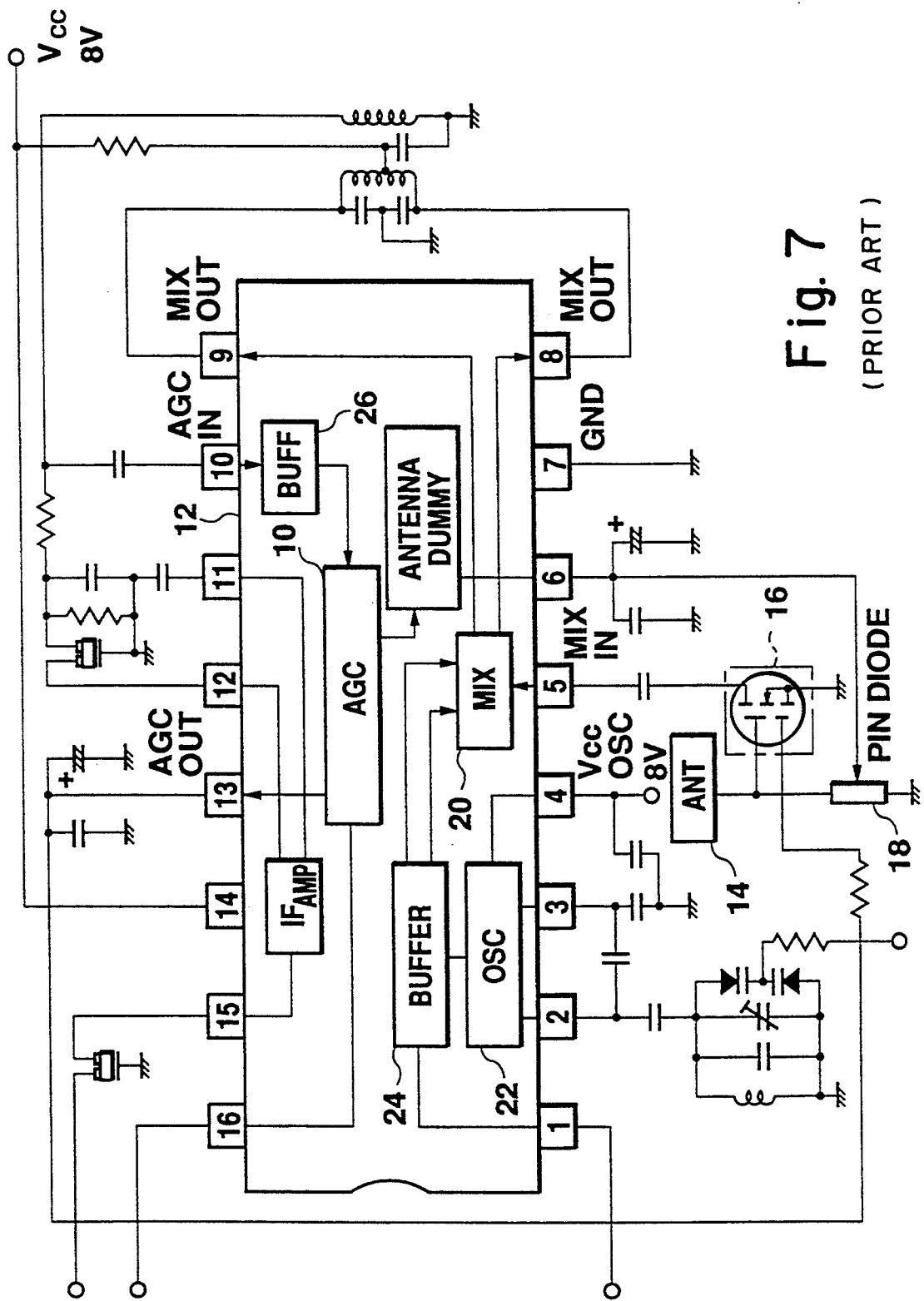
FIG. 7 is an equivalent circuit block diagram showing an example of a conventional AGC circuit.
Figure 8:
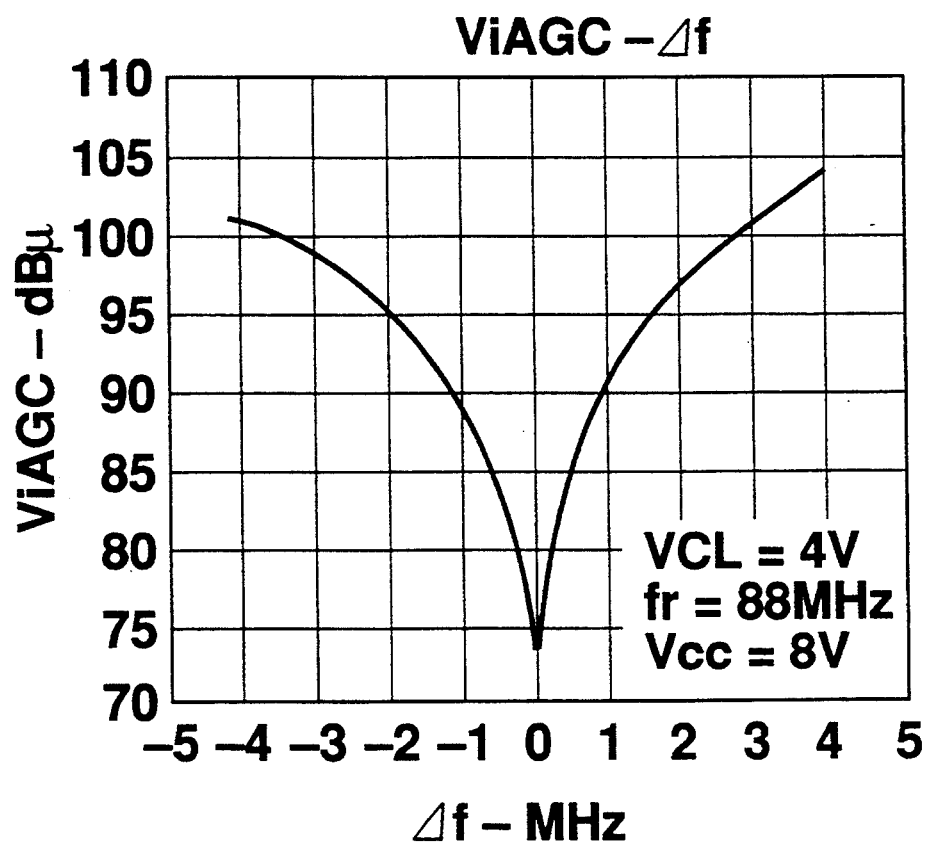
FIG. 8 is a conventional AGC sensitivity diagram.

Accordingly, the adder circuit 36 receives an input made by mutually adding both of the collector currents of the transistors 52, 56, and thereby a synthesized AGC controlling signal is supplied from the output terminal 36a to the attenuator 18 and the RF amplifier 16 shown in FIG. 7 to perform the gain control. As mentioned above, the adder circuit 36 contains an offset circuit therein.

The both level wave-detecting circuits 32, 34 are provided with basic power source circuits 60, 62 respectively to supply predetermined collector currents to the transistors 50, 54 respectively.

In this invention, furthermore, an AGC compensating signal is supplied from the S meter 42 to the first level wave-detecting circuit 32 in accordance with the output level of the IF section, as mentioned above. In the shown embodiment, the output of the S meter 42 is supplied to the level converting circuit 64, the output of which is then supplied from the transistor 66 to the basic power source circuit 60 of the first level wave-detecting circuit 32.

Accordingly, the detecting sensitivity of the first level wave-detecting circuit 32 can be compensated by the output of the IF output level, namely, the output of the S meter 42.

What is claimed is:

1. An AGC circuit for a radio receiver which detects a receiving signal level to generate an AGC signal corresponding to the detected signal level, and controls the gain of an RF amplifying circuit, comprising:
    (a) a filter circuit for allowing components of a predetermined frequency band in the output signal from a mixer connected to an output of said RF amplifying circuit to pass therethrough;
    (b) a first level detecting circuit having a frequency band restricted by said filter circuit, detecting an output signal level of the mixer, and forming a first AGC loop which has a detecting sensitivity varying in accordance with the degree of detuning with respect to an IF frequency;
    (c) a second level detecting circuit for detecting an input signal level of the mixer, and forming a second AGC loop which has a detecting sensitivity constant irrespective of the degree of detuning with respect to the IF frequency;
    (d) an adder circuit for adding the first level detecting signal to the second level detecting signal to output an AGC signal;
    (e) an S meter circuit for detecting the level of a desired signal output from an IF section to which the mixer output is supplied and sending an output to the first level detecting circuit; and
    (f) an AGC compensating circuit responsive to the output of the S meter circuit for reducing the output of said first level detecting circuit in accordance with the reduction in the level of the desired signal output from the IF section, for lowering the detecting sensitivity of the first AGC loop to reduce adjacent channel disturbance.

2. An AGC circuit according to claim 1, wherein the detecting sensitivity at the central frequency of said first level detecting circuit is set to a value higher than that of said second level detecting circuit.

3. An AGC circuit according to claim 1, wherein said first and second level detecting circuits each respectively comprises a transistor through which electric current flows in accordance with the input signal level and a condenser disposed downstream said transistor to maintain the upstream potential of the condenser in accordance with the amount of current flowing through the transistor.

4. An AGC circuit according to claim 3, wherein said adder circuit comprises a pair of transistors in which the amount of current flowing is determined in accordance with the upstream potential of the condenser of said first and second level detecting circuits, and the upstream of said pair of transistors is coupled to pass added current therethrough.

5. An AGC circuit according to claim 1 wherein said first level detecting circuit further comprises:
    a transistor through which electric current flows in accordance with the input signal level;
    a condenser disposed downstream of said transistor for maintaining the upstream potential of the condenser in accordance with the amount of current flowing through said transistor; and
    a basic power source circuit for maintaining the amount of current flowing through said transistor.

6. An AGC circuit according to claim 5, wherein said AGC compensating circuit includes a compensating transistor through which flows an amount of current determined in accordance with the output of the S meter circuit; and
    the output voltage of said reference power source is changed in accordance with the current value of the compensating transistor.

* * * * *